United States Patent [19]

Iwahashi et al.

[11] 4,395,724
[45] Jul. 26, 1983

[54] NONVOLATILE SEMICONDUCTOR MEMORY DEVICE

[75] Inventors: Hiroshi Iwahashi, Yokohama; Masamichi Asano, Musashino, both of Japan

[73] Assignee: Tokyo Shibaura Denki Kabushiki Kaisha, Japan

[21] Appl. No.: 180,435

[22] Filed: Aug. 22, 1980

[30] Foreign Application Priority Data

Aug. 31, 1979 [JP] Japan .................................. 54-111111

[51] Int. Cl.³ ...................... H01L 29/78; H01L 27/02
[52] U.S. Cl. .................................. 357/23 VT; 357/41
[58] Field of Search ...................... 357/23 VT, 41, 59

[56] References Cited

U.S. PATENT DOCUMENTS

| 3,825,945 | 7/1974 | Masuoka ................................ 357/23 |
| 4,099,196 | 7/1978 | Simko ................................ 357/59 X |
| 4,203,158 | 5/1980 | Frohman-Bentchkowsky et al. ................................ 357/41 X |

*Primary Examiner*—Martin H. Edlow
*Assistant Examiner*—J. Carroll
*Attorney, Agent, or Firm*—Finnegan, Henderson, Farabow, Garrett & Dunner

[57] ABSTRACT

In a nonvolatile semiconductor memory device using as memory cells insulated-gate type field effect transistors each having source and drain regions, a floating gate electrode, and a control gate electrode, the width of the floating and control gate electrodes is narrower at those portions which are located over a channel between the source and drain regions in each memory cell than at those portions which are not located over the channel.

3 Claims, 5 Drawing Figures

NONVOLATILE SEMICONDUCTOR MEMORY DEVICE

This invention relates to a nonvolatile semiconductor memory device using insulated-gate field effect transistors with both control and floating gate electrodes.

A nonvolatile semiconductor memory device is formed by using insulated-gate field effect transistors (hereinafter referred to as IGFET's). In this semiconductor memory device, charging and discharging on column lines connected with memory cells or IGFET's need to be accelerated in order to increase the speed of writing and reading of data. To attain this, the amount of current flowing through the channel of each IGFET needs to be increased. This amount of current is determined by a potential of the floating gate electrode which is a substantial gate electrode of the memory cell. The potential of the floating gate electrode at the time of impression of a potential to the control gate electrode is determined by a ratio of the capacity created between the floating gate and control gate electrodes and the capacity created between the floating gate electrode and the substrate inclusive of the channel. One method for raising the potential of the floating gate electrode to increase the amount of current is to increase the capacity created between the control gate electrode and floating gate electrode to be greater than the capacity created between the floating gate electrode and semiconductor substrate inclusive of the channel.

FIG. 1 is a cutaway view of a semiconductor memory device developed to fulfill the aforementioned requirements, showing four memory cells. In FIG. 1, N+-type diffusion layers 11a and 11b serve severally as source regions, and are formed substantially in parallel with each other in the row direction on the major surface of a P-type semiconductor substrate 10. N+-type diffusion layers 12a and 12b serve as common drain regions, and extend between the source regions 11a and 11b at a given distance from each other to form a channel therebetween. Drain contact holes 13a and 13b are formed in the middle of the drain regions 12a and 12b, respectively. Polycrystalline silicon layers 14a and 14b serve as floating gate electrodes, and are formed on a gate insulation film overlying two channel portions between the source region 11a and the drain regions 12a and 12b, while a polycrystalline silicon layer 15a serves as a control gate electrode, and is formed on another gate insulation film overlying the floating gate electrodes 14a and 14b. Likewise, floating gate electrodes 14c and 14d and a control gate electrode 15b are successively formed on gate insulation films overlying two channel portions between the other source region 11b and the drain regions 12a and 12b. Thus, an IGFET 16 is formed between the source region 11b and the drain region 12b, as indicated by a chain line in FIG. 1, for example.

FIG. 2 is a sectional view of the IGFET 16 taken along the channel portion in the row direction. In order to increase the capacity between the control gate electrode 15b and the floating gate electrode 14d, the IGFET 16 is so designed that portions thereof other than that portion which corresponds to the channel with width W may extend on both sides of the channel in the row direction along the control gate electrode 15b. As a result, the distance between the IGFET 16 and an IGFET 17 adjacent thereto is increased, as shown in FIG. 1, and the dimensions b×c of the IGFET 16 becomes 23.0 μm×13.5 μm, for example. Thus, the row-direction dimension b is expressly larger so that the chip size of the memory 5 device will be increased in the row direction.

Accordingly the object of this invention is to provide a nonvolatile semiconductor memory device capable of high-speed writing and reading operations without increasing the chip size.

According to this invention, the above object may be attained by a nonvolatile semiconductor memory device in which the width of the facing portions of a floating gate electrode and a control gate electrode along the longitudinal direction of a channel between source and drain regions of each IGFET forming a memory cell is narrower at these portions which are located over the channel than at those portions which are not located over the channel.

This invention can be more fully understood from the following detailed description when taken in conjunction with the accompanying drawings, in which.

Figure 3:
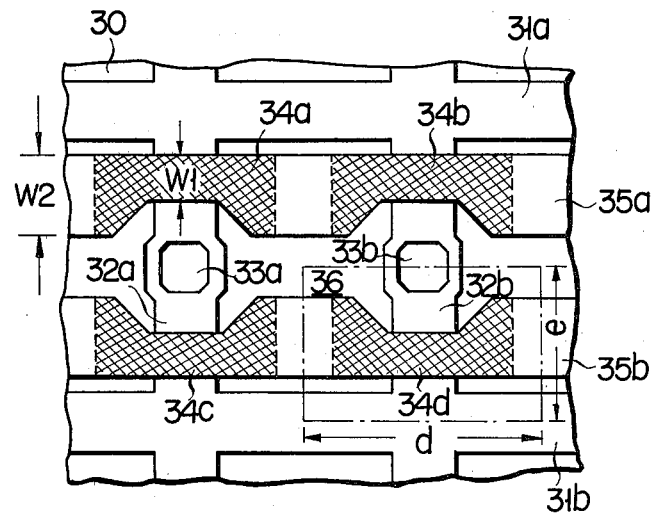
FIG. 3 is a cutaway plan view of a nonvolatile semiconductor memory device according to an embodiment of this invention.

In FIG. 3, N+-type diffusion layers 31a and 31b serve severally as source regions, and are formed substantially in parallel with each other in the row direction on the major surface of a P-type semiconductor substrate 30. N+-type diffusion layers 32a and 32b serve as common drain regions, and extend between the source regions 31a and 31b at a given distance from each other to form channels therebetween. Drain contact holes 33a and 33b are formed substantially in the middle of the drain regions 32a and 32b, respectively. Polycrystalline silcon layers 34a and 34b (reticulated portions) serve as floating gate electrodes, and are formed on a gate insulation film overlying two channel portions between the source region 31a and the drain regions 32a and 32b, while a polycrystalline silicon layer 35a serves as a control gate electrode, and is formed on another gate insulation film overlying the floating gate electrodes 34a and 34b. The side edges of the control gate electrode 35a and control gate electrode 35b which are adjacent the source regions 31a and 31b, respectively, extend in a straight line. The control gate electrode 35a and the floating gate electrodes 34a and 34b are so designed that their width W1 along the longitudinal direction of the channels between the source region 31a and the drain regions 32a and 32b at those portions which are located over the channels is narrower than the width W2 at those portions which are not located over the channels. Accordingly, the side edges of the floating gate electrodes 34a and 34b and the control gate electrode 35a which face the drain contact holes 33a and 33b are serrated in appearance, with the portions of these electrodes which are not located over the channels protruding towards the other control gate electrode 35b.

Figure 1:
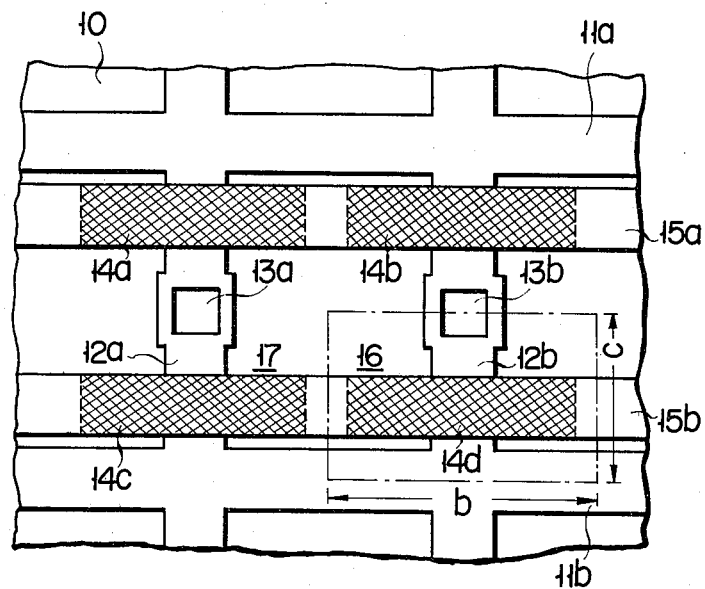
FIG. 1 is a cutaway plan view of a prior art nonvolatile semiconductor memory device.
Figure 2:
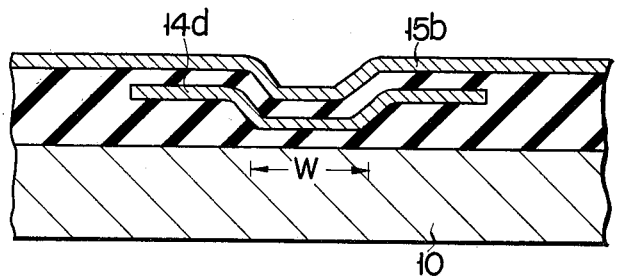
FIG. 2 is a sectional view of a one memory cell shown in FIG. 1 taken along its channel portion.

Likewise, the floating gate electrodes 34c and 34d (reticulated portions) and the control gate electrode 35b have the same configuration as aforesaid gate electrode 34a, 34b and 35a, and are successively formed on gate insulation films overlying two channel portions between the other source region 31b and the drain regions 32a and 32b. Thus, four IGFET's are formed between the source regions 31a and 31b and the common drain regions 32a and 32b. For example, an IGFET 36 formed between the source region 31b and the drain region 32b is enclosed with a chain line in FIG. 3. Here the row- and column-direction dimensions d and e of the IGFET 36 are 18.5 μm and 13.5 μm, respectively. Since the row-direction dimesion b of the memory cell in the prior art memory device shown in FIG. 1 is b=23.0 μm, the area of the IGFET 36 according to this invention is smaller than that of the IGFET 16 of FIG. 1 by approximately 20%. Generally, in an integrated circuit such as a nonvolatile semiconductor memory device using IGFET's as its memory cells as has been described in this specification, the intervals between the row lines, that is, the intervals between the central gate electrodes 35a and 35b and the drain contact holes 33a and 33b need to be kept larger than a given distance. This is inevitable for preventing a process error such as a possible deviation from the proper mask alignment during a photo engraving process (PEP). According to the embodiment of FIG. 3, however, the control gate electrodes 35a and 35b jut out into a vacant space between the drain contact holes 33a and 33b, so that the memory cells are subject to no functional problems.

With such construction of the IGFET's to serve as memory cells, the row-direction dimension of each memory cell becomes smaller than that of the conventional one to provide a high-density nonvolatile semiconductor memory device, although the facing area between the floating gate electrode and control gate electrode, that is, the value of capacity formed therebetween is the same as that of the conventional one.

Figure 4:
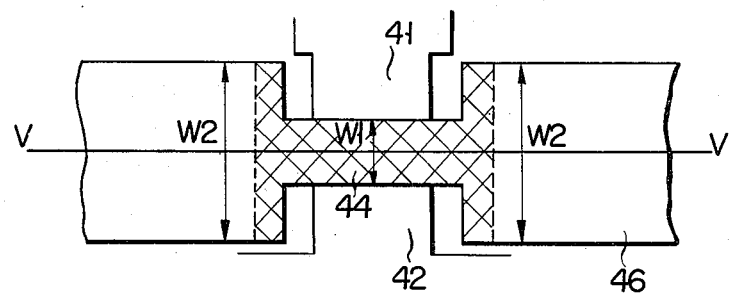
FIG. 4 is a plan view of a nonvolatile semiconductor memory device according to another embodiment of the invention.
Figure 5:
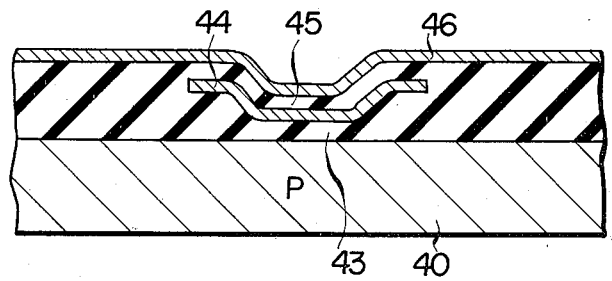
FIG. 5 is a sectional view of memory cell shown in FIG. 4 taken along its channel portion.

FIGS. 4 and 5 show another embodiment of the nonvolatile semiconductor memory device of this invention. In FIGS. 4 and 5, N+-type regions 41 and 42 are formed at a given distance from each other on the major surface of a P-type silicon substrate 40, serving respectively as a drain region and a source region. A floating gate electrode 44, extending in the widthwise direction (row direction) of a channel formed between the source and drain regions 42 and 41, is formed on a gate insulation film 43 formed of e.g. silicon dioxide overlying the channel. The floating gate electrode 44 is formed of e.g. polycrystalline silicon, and is so designed that a portion of the floating gate electrode 44 on the gate insulation film 43 corresponding to the channel has a smaller width W1 while those portions which are not located over the channel have a greater width W2. A control gate electrode 46 is formed on a gate insulation film 45 formed of e.g. silicon dioxide overlying the floating gate electrode 44 of such configuration. The control gate electrode 46 is formed of e.g. polycrystalline silicon, and is so designed that a portion thereof facing the floating gate electrode 44 is of substantially the same configuration as the electrode 44, extending with the width W2 in the row direction.

In the case of the embodiment shown in FIGS. 4 and 5, even if the facing area between the floating gate electrode 44 and control gate electrode 46, that is, the capacity between these electrodes, is the same as that of a conventional IGFET, the row-direction dimension of the memory cell can be reduced.

The configuration of the memory cell shown in FIG. 4 has sufficient allowance for deviation from proper mask alignment during the PEP, as compared with that shown in FIG. 1. For example, if a polycrystalline silicon layer used as both the control gate and floating gate electrodes deviates in the direction towards the lower part of FIG. 1, i.e., the control gate electrode 15b and the floating gate electrode 14d deviate in the direction of the source region 11b in which the control gate electrode 15b and the floating gate electrode 14d overlap with the source region 11b, the capacity created between the floating gate electrode 14d and the substrate inclusive of the channel increases. As a result the potential of the floating gate electrode is lowered. Also, the channel width changes partly.

On the other hand, according to the configuration of the memory cell shown in FIG. 4, even if the deviation in mask alignment during PEP occurs to the similar extent as in the configuration shown in FIG. 1, the overlapping area of the source region and the floating gate electrode scarcely increases, so that the capacity created between the floating gate electrode and the substrate inclusive of the channel scarcely increases and the potential of the floating gate electrode is scarcely lowered. Also no undesirable effect is applied on the channel region. The reason for this is that the size of the memory cell of FIG. 4 is decreased in the row direction thereof, while size in the column direction is slightly increased as a result of the deviation.

When comparing the memory cells shown in FIGS. 1, 3 and 4, the relative size of the memory cells in the row direction can be described in the following order, FIG. 1=FIG. 3>FIG. 4 for the case of the capacity between the floating gate electrode and the control gate electrode in each of the memory cells in FIGS. 1, 3 and 4 is being the same. Accordingly, allowance for the possible deviation from the proper mask alignment during the PEP of the memory cell of FIG. 4 is larger than those shown in FIGS. 1 and 3, and that shown in FIG. 3 is larger than that shown in FIG. 1.

In the above-mentioned embodiment, only the facing area between the floating gate electrode and control gate electrode is taken into account for the increase of the capacity between these gate electrodes. It is to be understood, however, that the capacity can generally be changed according to the distance between two facing electrodes and the dielectric constant of a dielectric interposed between the electrodes, besides the facing area therebetween, and that such changing methods may additionally be applied to the above embodiment.

What is claimed is:

1. A nonvolatile semiconductor memory device, comprising:
   a semiconductor substrate of a preselected conductivity type;
   a drain region formed on said semiconductor substrate, said drain region having first and second oppositely disposed end portions and a contact hole substantially midway between said end portions;
   first and second source regions formed on said semiconductor substrate adjacent but spaced apart from said first and second end portions of said drain region, respectively, by a predetermined distance;
   first and second channel regions formed, respectively, between said first end of said drain region and said first source region, and between said second end of said drain region and said second source region;

a first gate insulation film overlying said first and second channel regions;

first and second floating gate electrodes formed on said first gate insulation film and overlying, respectively, said first and said second channel regions;

a second gate insulation film overlying said first and second floating gate electrodes; and first and second control gate electrodes formed on said second gate insulating film and overlying entirely said first and second floating gate electrodes, respectively, wherein the width dimension of each of said floating gate electrodes and said control gate electrodes is narrower at portions thereof located directed over said channel regions, than at portions thereof which are not located directly over said channel regions.

2. A nonvolatile semiconductor memory device according to claim 5 wherein said portions of said first floating gate electrode and said first control gate electrode not located over said first channel region extend towards said portions of said second floating electrode and second control gate electrode not located over said first channel region.

3. A nonvolatile semiconductor memory device according to claim 1 wherein said portions of each of said control gate electrodes and said floating gate electrodes not located over said channel regions each have an edge which is located a substantially constant distance from said contact hole.

* * * * *